United States Patent
Hembree et al.

(10) Patent No.: US 6,181,144 B1
(45) Date of Patent: Jan. 30, 2001

(54) SEMICONDUCTOR PROBE CARD HAVING RESISTANCE MEASURING CIRCUITRY AND METHOD FABRICATION

(75) Inventors: David R. Hembree; Salman Akram, both of Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/030,181

(22) Filed: Feb. 25, 1998

(51) Int. Cl.[7] .................... G01R 31/02; H01H 31/02
(52) U.S. Cl. .................................... 324/754; 324/537
(58) Field of Search .......................... 324/754, 500, 324/537

(56) References Cited

U.S. PATENT DOCUMENTS

| | | | |
|---|---|---|---|
| 3,809,625 | 5/1974 | Brown et al. | 204/15 |
| 4,027,935 | 6/1977 | Byrnes et al. | 339/48 |
| 4,161,692 * | 7/1979 | Tarwell | 324/754 |
| 4,585,991 | 4/1986 | Reid et al. | 324/158 P |
| 4,906,920 | 3/1990 | Huff et al. | 324/158 P |
| 5,042,148 | 8/1991 | Tada et al. | 29/852 |
| 5,172,050 | 12/1992 | Swapp | 324/158 P |
| 5,177,439 | 1/1993 | Liu et al. | 324/158 P |
| 5,180,977 | 1/1993 | Huff | 324/158 P |
| 5,225,037 | 7/1993 | Elder et al. | 156/644 |
| 5,264,787 | 11/1993 | Woith et al. | 324/158 P |
| 5,483,741 | 1/1996 | Akram et al. | 29/846 |
| 5,565,767 * | 10/1996 | Yoshimizu et al. | 324/158.1 |
| 5,678,301 | 10/1997 | Gochnour et al. | 29/827 |
| 5,686,317 | 11/1997 | Akram et al. | 437/8 |
| 5,712,571 * | 1/1998 | O'Donoghue | 324/754 |
| 5,915,977 | 6/1999 | Hembree et al. | |
| 5,917,329 * | 6/1999 | Cadwallader et al. | 324/754 |
| 5,926,029 * | 7/1999 | Ference et al. | 324/757 |
| 5,931,685 | 8/1999 | Hembree et al. | |
| 5,962,921 | 10/1999 | Farnworth et al. | |

* cited by examiner

Primary Examiner—Safet Metjahic
Assistant Examiner—Jermele M. Hollington
(74) Attorney, Agent, or Firm—Stephen A. Gratton

(57) ABSTRACT

A probe card for testing semiconductor wafers, and a method for fabricating the probe card are provided. The probe card is adapted for use with a wafer probe handler, and a tester containing test circuitry. The probe card includes a substrate, and patterns of probe contacts formed on the substrate. Several different embodiments for the probe contacts are provided, including: etched projections covered with a conductive layer, microbumps formed on an electrically insulating polymer layer, indentations covered with conductive layers, and microbumps deposited in openings in an elastomeric mask layer. Some of the probe contacts are arranged in a four point Kelvin structure, adapted to measure a contact resistance between the probe contacts, and mating contacts on the wafer.

20 Claims, 5 Drawing Sheets

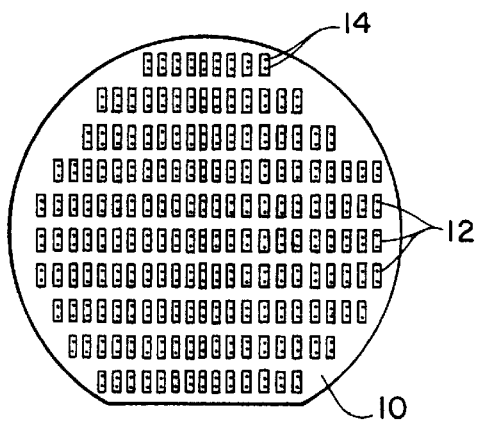
FIGURE 1
(PRIOR ART)
FIGURE 2
(PRIOR ART)
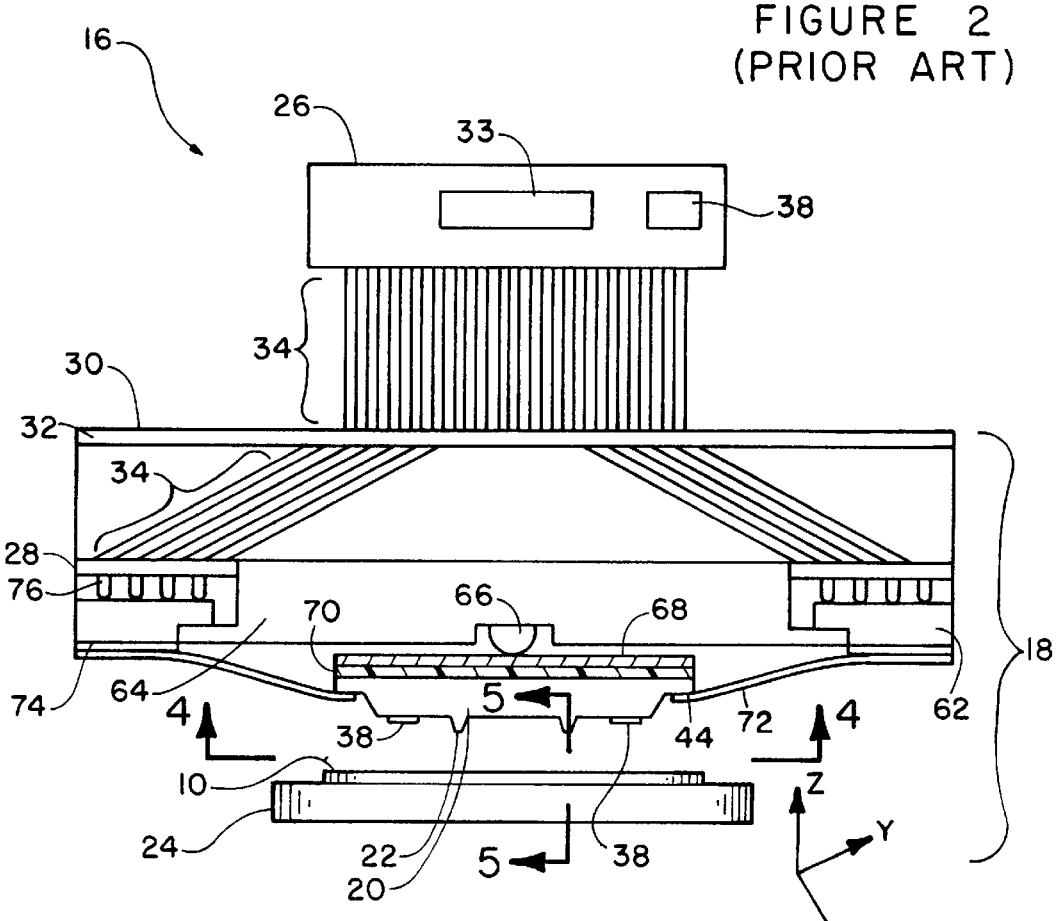
FIGURE 3

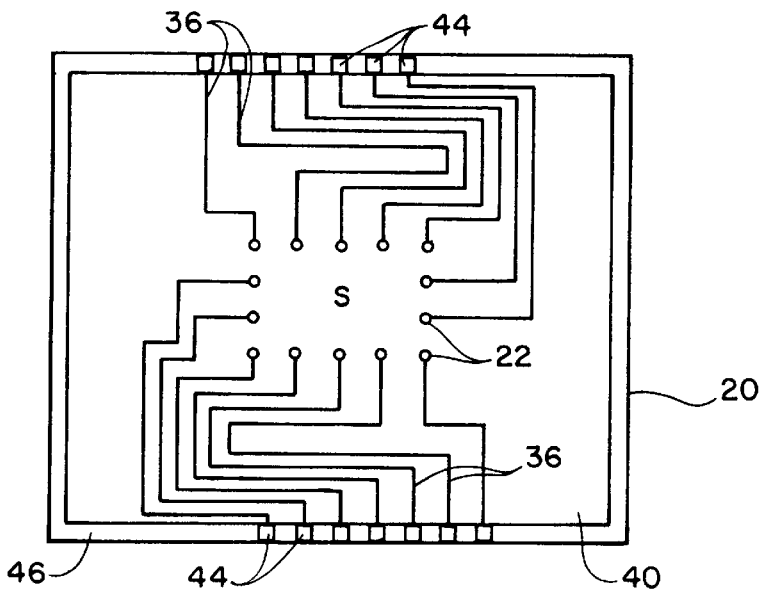
FIGURE 4
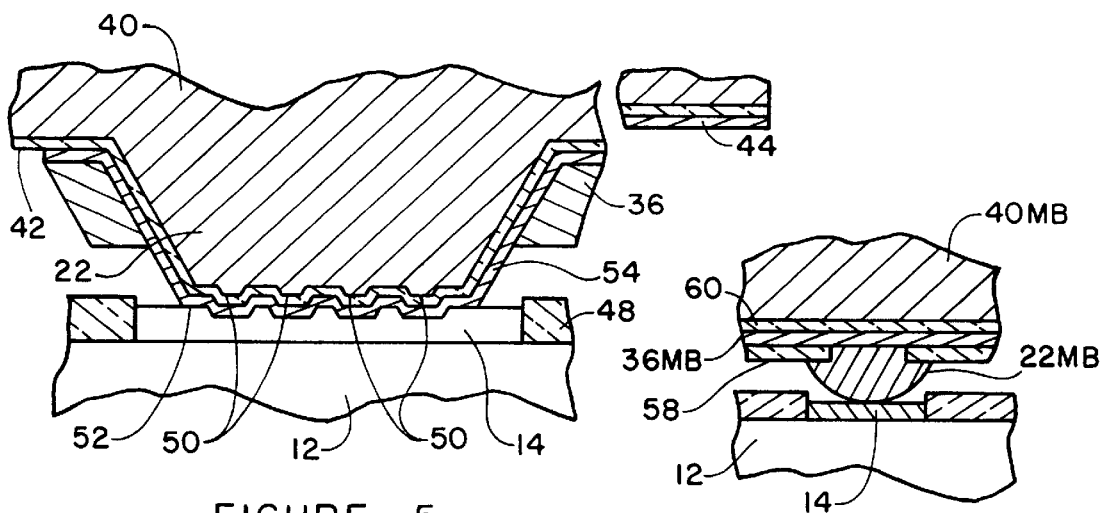
FIGURE 5
FIGURE 5B
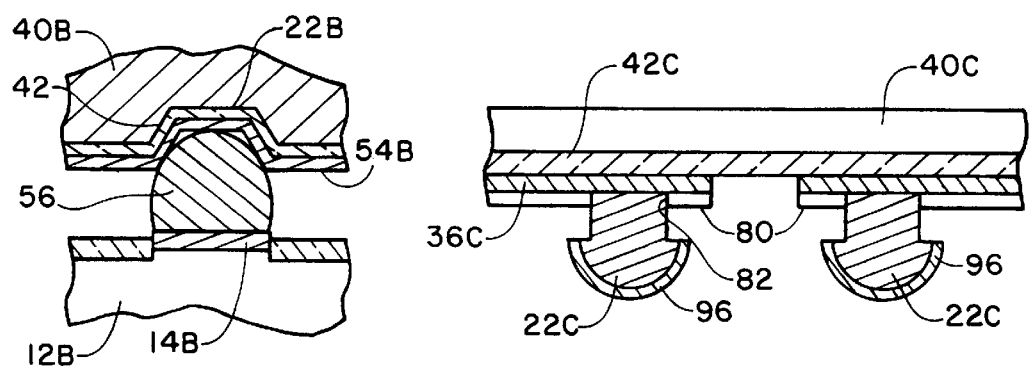
FIGURE 5A
FIGURE 5C

SEMICONDUCTOR PROBE CARD HAVING RESISTANCE MEASURING CIRCUITRY AND METHOD FABRICATION

FIELD OF THE INVENTION

This invention relates generally to semiconductor manufacture and specifically to a probe card for testing semiconductor wafers. This invention also relates to a method for fabricating the probe card, to a method for testing using the probe card, and to a test system employing the probe card.

BACKGROUND OF THE INVENTION

Semiconductor wafers are tested prior to singulation into individual dice, to assess the electrical characteristics of the integrated circuits contained on the dice. A typical wafer-level test system includes a wafer handler for handling and positioning the wafers, a test controller for generating test signals, and a probe card for making temporary electrical connections with the wafer. In addition, a performance board associated with the probe card contains driver circuitry for transmitting the test signals to the probe card.

The test signals can include specific combinations of voltages and currents transmitted through the performance board and probe card to the wafer. During the test procedure response signals such as voltage, current and frequency can be analyzed and compared by the test controller to required values. The integrated circuits that do not meet specification can be marked or mapped in software. Following testing, defective circuits can be repaired by actuating fuses (or anti-fuses) to inactivate the defective circuitry and substitute redundant circuitry.

Different types of probe cards have been developed for probe testing semiconductor wafers. The most common type of probe card includes elongated needle probes adapted to electrically engage corresponding contacts on the wafer. An exemplary probe card having needle probes is described in U.S. Pat. No. 4,563,640 to Hasegawa et al. Another type of probe card includes buckle beam probes adapted to flex upon contact with the wafer. This type of probe card is described in U.S. Pat. No. 4,027,935 to Byrnes et al. Yet another type of probe card, referred to as a "membrane probe card", includes a membrane, such as polyimide, having contacts in the form of contact bumps thereon. An exemplary membrane probe card is described in U.S. Pat. No. 4,918,383 to Huff et al. Still another type of conventional probe card includes a silicon substrate and probe tips that have been micro machined and covered with a conductive layer. Such a probe card is described in U.S. Pat. No. 5,177,439 to Liu et al.

With any of the above types of probe cards, contacts on the probe card (e.g., probe needles, contact bumps, probe tips) must electrically engage contacts on the wafer (e.g., test pads, bond pads). A problem with making these electrical connections is that the electrical resistivity of the probe contacts can increase with continuous use of the probe card. Probe cards are designed to be used over extended periods of time with periodic cleaning and adjustments. However, a single probe card may test thousands of wafers prior to being cleaned and adjusted.

With extended use, the probe contacts can become covered with contaminants, such as particles, and residual photoresist from wafer fabrication processes. These contaminants tend to increase the electrical resistivity of the electrical connections between the probe contacts and the wafer contacts. The increased resistivity can increase the time required for test signals to be transmitted and received from the wafer. Also voltage and current values of the test signals can be adversely affected by the increased resistivity. The wafer contacts (e.g., aluminum bond pads) can also include layers that may affect the resistivity of the temporary electrical connections with the probe card, and the test signals transmitted through these connections.

In addition to contaminants which may affect resistivity, the metallic surfaces of the probe contacts and wafer contacts will typically be covered with a film of some type. Base metals such as copper, aluminum and nickel include a surface film comprising a metal oxide. This surface film can be up to several hundred Angstroms thick. Noble metals such as gold, can also include adsorbed gases, water vapor and organic molecules. The films are electrically insulative and can interfere with the free flow of electrons between the mating contacts.

It would be advantageous to be able to evaluate the electrical resistivity of the probe contacts and of the wafer contacts. In addition, it would be advantageous to be able to evaluate the contact resistance between the probe contacts and wafer contacts during a test procedure. These resistivity measurements could then be used during transmission and evaluation of test signals. This information could also be used to indicate cleaning of a probe card is required.

In view of the foregoing, the present invention is directed to an improved probe card that includes resistivity measuring circuitry, and to a method for fabricating the probe card.

SUMMARY OF THE INVENTION

In accordance with the present invention, an improved probe card for testing semiconductor wafers, a test system employing the probe card, a method for testing using the probe card, and a method for fabricating the probe card are provided. The probe card includes a substrate formed of a rigid material, such as silicon or ceramic, and a pattern of probe contacts formed on the substrate. The probe contacts are configured to electrically engage wafer contacts contained on a wafer under test.

Some of the probe contacts comprise resistivity contacts, which are configured to electrically engage selected wafer contacts. Preferably, the selected wafer contacts comprise interconnected power (Vcc), or ground (Vss) pads, of semiconductor dice contained on the wafer. With the resistivity contacts in electrical engagement with the selected wafer contacts an electrical path between the resistivity contacts is provided.

The resistivity contacts are adapted for use with a resistivity measuring circuit. The resistivity measuring circuit evaluates a total resistance $R_x$ of the electrical path between the resistivity contacts. A high value for $R_x$ can indicate a high contact resistance between the probe contacts and the wafer contacts, such as would occur with misaligned or damaged contacts. A high value for $R_x$ can also indicate high resistivity in the probe contacts or wafer contacts, such as would occur with thick metal oxides, or contaminants.

The resistivity contacts include two impedance sense leads, and two impedance source leads configured as a four point Kelvin structure. With this arrangement, a test current can be applied through a known resistance RL to the resistivity contacts. In addition, a sense current can be applied through known resistances to the resistivity contacts. The sense current is very low (e.g., pico-amps) such that the I-R drop is low, and the voltage seen by the sense terminals is the same as the voltage developed across the resistivity contacts. This enables a total resistance $R_x$ of the electrical path between the resistivity contacts to be quantified. The resistance $R_x$ can be used to provide feed back for adjusting test signal voltages and currents. The resistance $R_x$ can also be used to indicate that the probe card (or the wafer) requires cleaning.

Several different embodiments of the probe card are provided. In a first embodiment, the probe contacts comprise etched projections covered with a conductive layer. In a second embodiment, the probe contacts comprise microbumps formed on an electrically insulating polymer layer. In a third embodiment, the probe contacts comprise indentations covered with conductive layers, and configured to electrically engage bumped wafer contacts (e.g., solder balls). In a fourth embodiment, the probe contacts comprise microbumps deposited in openings in an elastomeric mask layer.

A system constructed in accordance with the invention includes the probe card, a wafer handler and a tester. The tester includes the resistivity measuring circuitry and test circuitry. The wafer handler includes a wafer chuck for moving the wafer in x and y directions for aligning the wafer to the probe card, and in a z direction for moving the wafer into contact with the probe card. The probe card can be compliantly mounted to the wafer handler on a rigid mounting plate having an elastomeric cushioning member.

BRIEF DESCRIPTION OF THE DRAWINGS

FIG. 1 is a plan view of a prior art semiconductor wafer containing multiple semiconductor dice;

FIG. 2 is a plan view of a prior art semiconductor die illustrating contacts on the die and exemplary functional designations for the contacts;

FIG. 3 is a schematic cross sectional view of a test system constructed in accordance with the invention;

FIG. 4 is an enlarged cross sectional view taken along section line 4—4 of FIG. 3 illustrating a probe card constructed in accordance with the invention;

FIG. 5 is an enlarged cross sectional view taken along section line 5—5 of FIG. 3 following contact of the probe card and wafer and illustrating probe card contacts electrically engaging wafer contacts;

FIG. 5A is an enlarged cross sectional view equivalent to FIG. 5 of an alternate embodiment probe card contact electrically engaging bumped contacts on the wafer;

FIG. 5B is an enlarged cross sectional view equivalent to FIG. 5 of an alternate embodiment probe card contact electrically engaging the contacts on the wafer;

FIG. 5C is an enlarged cross sectional view equivalent to FIG. 5 of alternate embodiment probe card contacts;

DETAILED DESCRIPTION OF THE PREFERRED EMBODIMENTS

Figure 6A:
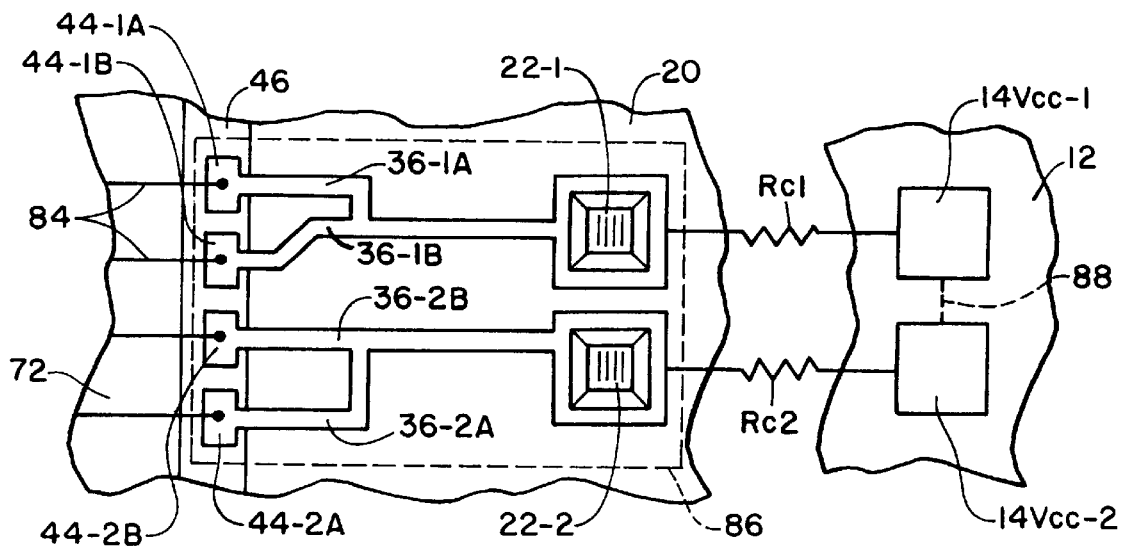
FIG. 6A is a schematic plan view of resistivity contacts on the probe card and wafer contacts on the wafer configured for electrical engagement with the resistivity contacts.

Referring to FIG. 1, a prior art semiconductor wafer 10 includes multiple semiconductor dice 12 fabricated using processes that are well known in the art. The wafer 10 also includes multiple wafer contacts 14. As shown in FIG. 2, the contacts 14 comprise metal bond pads in electrical communication with integrated circuits contained on the dice 14. For illustrative purposes, each die 12 includes twenty eight contacts 14 with the functional designations indicated in FIG. 2. However, as is apparent, the number and functional arrangements of the contacts 14 are merely exemplary, and other arrangements are possible.

Following singulation of the wafer 10, the dice 12 can be used to fabricate semiconductor packages. In this case, the contacts 14 can be wire bonded to lead fingers formed on a leadframe. The singulated dice 12 can also be used in unpackaged form as known good die (KGD). In this case, the contacts 14 can be wire bonded to a substrate, such as a printed circuit board, or alternately flip chip mounted using reflowed solder bumps. The singulated dice 12 can also be included in chip scale packages. In this case, interconnects such as beam leads electrically contact the contacts 14 to establish electrical communication with mating external contacts on a substrate.

Referring to FIG. 3, a test system 16 constructed in accordance with the invention, and configured to test the dice 12 contained on the wafer 10 is shown. The test system 16 includes a probe card 20 having probe contacts 22 configured to make temporary electrical connections with the wafer contacts 14. The test system 16 also includes a wafer handler 18 wherein the probe card 20 is mounted. In addition, the test system 16 includes a tester 26 configured to apply test signals through the probe card 20 to the wafer 10 and to analyze the resultant signals. Suitable testers 26 are commercially available from Teradyne as well as other manufacturers.

The wafer handler 18 includes a test head 30 wherein the probe card 20 is mounted. The wafer handler 18 also includes a wafer chuck 24 configured to move in X and Y directions to align the wafer 10 with the probe card 20, and in the Z direction to move the wafer 10 into contact with the probe card 20. One suitable wafer handler 18 is manufactured by Electroglass and is designated a Model 4080.

The test system 16 also includes a prober interface board 28 for routing test signals from the tester 26 to the probe card 20. The prober interface board 28 can be mounted to the test head 30 of the wafer handler 18. In addition, the prober interface board 28 can be in electrical communication with tester pin electronics 32 physically located in the test head 30. The tester pin electronics 32 provide separate electrical paths 34 from test circuitry 33 and resistivity measuring circuitry 38 contained in the tester 26, to the prober interface board 28.

The wafer handler 18 includes a probe card fixture 62, a force applying fixture 64 and a force applying mechanism 66. These items can be components of a conventional wafer handler as previously described. The force applying mechanism 66 presses against a pressure plate 68 and a compressible member 70 to bias the probe card 20 against the wafer 10. By way of example, the compressible member 70 can be formed of an elastomeric material such as silicone, butyl rubber, or fluorosilicone; in foam, gel, solid or molded configurations.

In addition, a flexible membrane 72 is bonded to the probe card 20 and to the probe card fixture 62. In general, the flexible membrane 72 functions to physically attach the probe card 20 to the probe card fixture 62. In addition, the flexible membrane 72 functions to provide electrical paths from the contacts 22 to the probe card fixture 62 and prober interface board 28. The flexible membrane 72 can be formed of thin flexible materials to allow movement of the probe card 20 in z-directions. For example, the flexible membrane 72 can be formed of a flexible multi layered material similar to TAB tape.

In the illustrative embodiment, the flexible membrane 72 comprises a layer of polymer tape having metal conductors 84 (FIG. 6A) thereon. Bonded connections are formed between the conductors 84 on the membrane 72 and corresponding conductors 74 on the probe card fixture 62. In addition, bonded connections are formed between the conductors 84 on the membrane 72 and the bonding pads 44 on the probe card 20.

Still referring to FIG. 3, the wafer handler 18 includes spring loaded electrical connectors 76 which are in electrical communication with the prober interface board 28. One type of spring loaded electrical connector 76 is manufactured by Pogo Industries of Kansas City, Mo. under the trademark "POGO PINS". The electrical connectors 76 electrically communicate with corresponding conductors on the probe card fixture 62.

The probe card mounting arrangement shown in FIG. 3, as well as others, are described in U.S. patent application Ser. No. 08/797,719, entitled "Probe Card For Semiconductor Wafers And Method And System For Testing Wafers", incorporated herein by reference. However, it is to be understood that these mounting arrangements are merely exemplary and the probe card 20 can be mounted in a conventional manner on a commercially available wafer handler.

Referring to FIG. 4, further details of the probe card 20 are illustrated. The probe contacts 22 on the probe card 20 are arranged in patterns corresponding to the patterns of the wafer contacts 14. Each pattern of probe contacts 22 represents a single test site S. For simplicity, only one test site S on the probe card 20 is illustrated. However, in actual practice the probe card 20 can include multiple patterns of probe contacts 22 forming multiple test sites S to accommodate testing of multiple dice 12 at the same time.

In general, in order to test multiple dice 12 at the same time certain conditions must be met. Firstly, the patterns of probe contacts 22 must exactly match the patterns of the wafer contacts 14. In addition, the stepping distance (i.e., x-y repeat and pattern spacing) must be the same for the probe contacts 22 as for the die contacts 14. Secondly, the software that controls the stepping process must be able to pick valid test sites. For example, when testing at the edges of a round wafer with a probe card that includes rectangular or square patterns of probe contacts 22, some patterns of probe contacts 22 will not have an associated device under test. It is also desirable to not have probe contacts 22 contacting a passivation layer on the dice 12 as this can damage the contacts 22.

Still referring to FIG. 4, in addition to the patterns of probe contacts 22, the probe card 20 includes patterns of conductors 36 in electrical communication with the probe contacts 22. The probe contacts 22 and conductors 36 are formed on a substrate 40 of the probe card 20. The substrate 40 can be formed of a rigid material able to resist deflection and buckling during test procedures using the probe card 20. Preferred materials include silicon, gallium arsenide, ceramic and glass filled resins, such as FR-4. In addition to being rigid, these materials have a coefficient of thermal expansion (CTE) closely matching that of the semiconductor wafer 10.

In the illustrative embodiment, the substrate 40 comprises silicon. With silicon, an electrically insulating layer 42 (FIG. 5), such as $SiO_2$, can be formed-on the substrate 40 to provide insulation for the probe contacts 22 and conductors 36. With the substrate 40 formed of an electrically insulating material, such as ceramic, the insulating layer 42 is not required.

The conductors 36 are formed on the substrate 40 to provide electrical paths from the test circuitry 33 (FIG. 3) and the resistivity measuring circuitry 38 (FIG. 3) to the probe contacts 22. The conductors 36 are preferably formed of a highly conductive metal such as copper, aluminum, titanium, tantalum, tungsten, molybdenum or alloys of these metals. The conductors 36 can be formed as a single layer of metal, or as a bi-metal stack. In addition, the conductors 36 can be formed using a thin film deposition process (e.g., CVD, patterning, etching), or using a thick film deposition process (e.g., screen printing, stenciling).

The conductors 36 also include bonding pads 44 located along the peripheral edges of the probe card 20. The bonding pads 44 provide bonding sites for forming separate electrical paths from a probe card fixture 62 (FIG. 1) to each of the conductors 36. Preferably the bonding pads 44 are located on recessed surfaces 46 of the substrate 40 to provide clearance for TAB bonds, wire bonds or other electrical connections to the bonding pads 44.

Referring to FIG. 5, the probe contacts 22 can be formed as raised members that project from a surface of the substrate 40. The raised probe contacts 22 help to provide a separation distance between the probe card 20 and the wafer 10 to clear any particulate contaminants that may be present on the opposing surfaces. In addition, the probe contacts 22 can include penetrating projections 50 adapted to penetrate the wafer contacts 14 to a limited penetration depth. In particular, the penetrating projections 50 have a height that is less than a thickness of the wafer contacts 14. For thin film aluminum wafer contacts 14, this thickness will typically be less than 2.0 $\mu$m. As also shown in FIG. 5, surfaces 52 at the tips of the probe contacts 22 provide stop planes for limiting penetration of the probe contacts 22 into the wafer contacts 14. These stop plane surfaces 52, along with the dimensions of the penetrating projections 50, insures that the probe contacts 22 minimally damage the wafer contacts 14 during a test procedure.

The probe contacts 22 and penetrating projections 50 can be formed integrally with the substrate 40 using a semiconductor fabrication process such as bulk micromachining. Such a process permits the probe contacts 22, and penetrating projections 50, to be formed accurately in a dense array.

Each probe contact 22 is covered with a conductive layer 54 in electrical communication with a conductor 36. The conductive layers 54 for all of the probe contacts 22 can be formed of a metal layer deposited and patterned to cover the probe contacts 22, or other selected areas of the substrate 40. By way of example, the conductive layers 54 for the probe contacts 22 can be formed of aluminum, copper, titanium, tungsten, tantalum, platinum, molybdenum, cobalt, nickel, gold, iridium or alloys of these metals. Some of these materials such as gold and platinum are non-reactive so that material transfer between the probe contacts 22 and wafer contacts 14 can be minimized. The conductive layers 54 can also be a metal silicide or a conductive material such as polysilicon. In addition, the conductive layers 54 can be formed as a bi-metal stack comprising a base layer and a non-reactive and oxidation resistant outer layer such as gold or platinum.

The conductive layers 54 can be formed using a metallization process comprising deposition (e.g., CVD), followed by photo patterning and etching. The conductive layer 54 for each probe contact 22 is in electrical communication with a corresponding conductor 36 formed on the interconnect substrate 18. The conductive layers 54 and conductors 36 can be formed at the same time using the same metallization process. Alternately, the conductive layers 54 can be formed of a different metal than the conductors 36 using separate metallization process. A process for fabricating the probe contacts 22 is described in U.S. Pat. No. 5,483,741, incorporated herein by reference.

Referring to FIG. 5A, an alternate embodiment probe contact 22B is configured to electrically engage wafer contacts 14B having solder bumps 56 formed thereon. The probe contacts 22B permit bumped dice 12B to be tested. The probe contact 22B comprises an indentation formed in a substrate 40B. In this embodiment the substrate 40B can comprise silicon, gallium arsenide or ceramic. The indentation can be etched or machined to a required size and shape, and then covered with a conductive layer 54B. The probe contact 22B is configured to retain the solder bump 56. The conductive layer 54B for the probe contact 22B is in electrical communication with a conductor equivalent to the conductors 36 previously described. Further details of probe contacts 22B are described in U.S. Pat. No. 5,962,921 entitled "Interconnect Having Recessed Contact Members With Penetrating Blades For Testing Semiconductor Dice And Packages With Contact Bumps", incorporated herein by reference.

Referring to FIG. 5B, an alternate embodiment probe contact 22MB comprises a metal microbump formed on a polymer film 58 similar to multi layered TAB tape. In addition, a conductor 36MB is formed on an opposing side of the polymer film 58 in electrical communication with the contact 22MB. A compliant adhesive layer 60 attaches the polymer film 58 to a substrate 40MB. Depending on the substrate material an insulating layer 42B can also be provided on the substrate 40MB. Further details of probe contact 22MB are described in U.S. Pat. No. 5,678,301, entitled "Method For Forming An Interconnect For Testing Unpackaged Semiconductor Dice".

Referring to FIG. 5C, alternate embodiment probe contacts 22C are illustrated. The probe contacts 22C are formed on a substrate 40C having an insulating layer 42C formed thereon. In addition, the probe contacts 22C are in electrical communication with conductors 36C. A mask layer 80 is formed on the conductors 36C, and the probe contacts 22C are formed in openings 82 in the mask layer 80. Further details of the probe contacts 22C, including a fabrication process, will subsequently be described with reference to FIGS. 8A–8D.

Figure 6B:
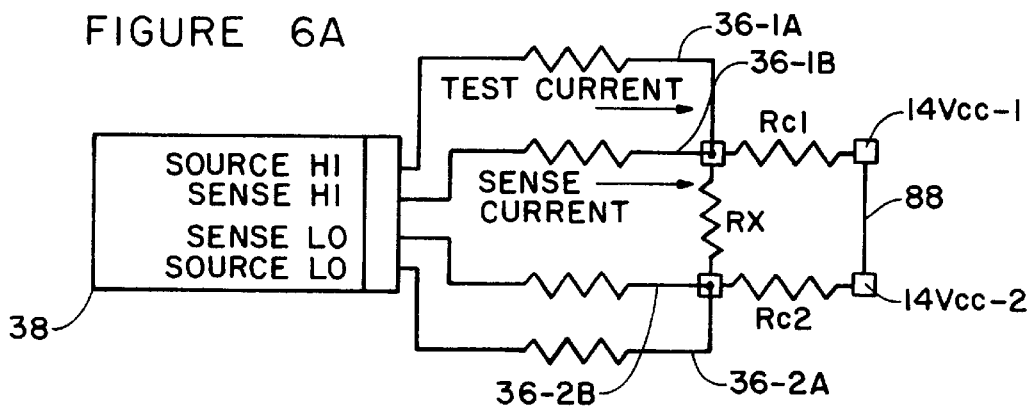
FIG. 6B is a schematic electrical diagram of a resistivity measuring circuit.

Referring to FIGS. 6A and 6B, resistivity contacts 22-1, 22-2 (FIG. 6A) and resistivity measuring circuit 38 (FIG. 6B) are illustrated. The resistivity measuring circuit 38 (FIG. 6B) can be included in a conventional digital multimeter contained within the tester 26. This type of multimeter is commercially available from Keithley Instruments, Cleveland, Ohio, and other instrument manufacturers.

Resistivity contact 22-1 is in electrical communication with a source hi conductor 36-1A and associated bonding pad 44-1A. Resistivity contact 22-1 is also in electrical communication with a sense hi conductor 36-IB and associated bonding pad 44-1B. Resistivity contact 22-2 is in electrical communication with a source low conductor 36-2A and associated bonding pad 44-2A. Resistivity contact 22-2 is also in electrical communication with a sense low conductor 36-2B and associated bonding pad 44-2B. The resistivity contacts 22-1, 22-2, and bonding pads 44-1A, 44-1B, 44-2B, 44-2A form a four point Kelvin structure 86.

The bonding pads 44-1A, 44-1B, 44-2B, 44-2A are in electrical communication with conductors 84 on the flexible membrane 72. The conductors 84 are in electrical communication with the resistivity measuring circuit 38 contained in the tester 26.

The resistivity contacts 22-1, 22-2 are configured to electrically engage wafer contacts 14Vcc-1, 14Vcc-2. The wafer contacts 14Vcc-1, 14Vcc-2 are in electrical communication with one another via internal traces 88 contained within the particular die 12 on which the wafer contacts 14Vcc are formed. Alternately, instead of wafer contacts 14Vcc-1, 14Vcc-2, Vss contacts on the die 12 can be utilized. This is because the Vss contacts on the die 12 are also in electrical communication via internal traces.

With this arrangement, an unknown resistance $R_x$ (FIG. 6B) between the resistivity contacts 22-1, 22-2 can be measured by applying a test current from source terminals (source Hi, source Lo) through a known resistance RL to the resistivity contacts 22-1, 22-2. In addition, a sense current can be applied from sense terminals (sense Hi, sense Lo) through known resistances to the resistivity contacts 22-1, 22-2. The sense current is very low (e.g., pico-amps) such that the I-R drop is low and the voltage seen by the sense terminals (sense Hi, sense Lo) is the same as the voltage developed across $R_x$. This enables $R_x$ to be quantified and evaluated. One method for evaluating the resistance $R_x$ is by making resistance measurements when the probe card 20 is new, or immediately following cleaning. These initial values for $R_x$ can then be compared to measured values for $R_x$ during test procedures using the probe card 20.

Figure 7:
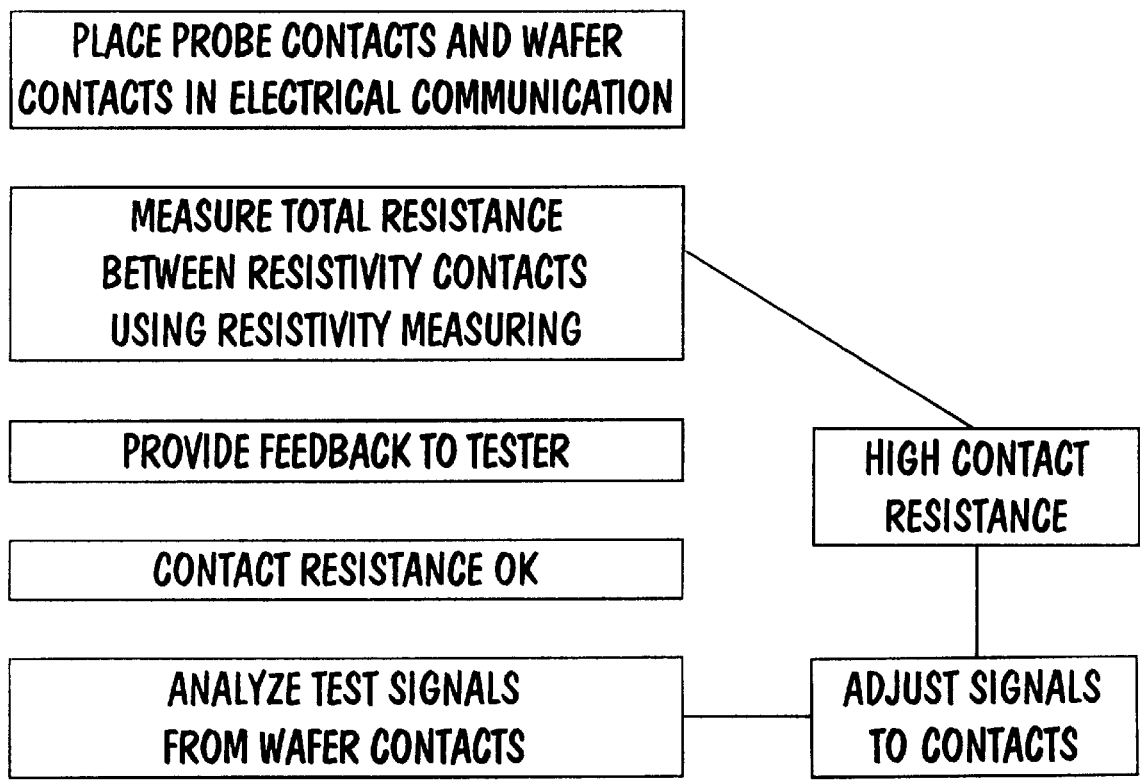
FIG. 7 is a flow diagram of a test method performed in accordance with the invention.

The contact resistances (Rc1 and Rc2) between the resistivity contacts 22-1, 22-2 and the wafer contacts 14Vcc-1, 14Vcc-2 is a major component of the resistance $R_x$. Accordingly, a high value for $R_x$ may indicate that the electrical connections between the probe contacts 22 and wafer contacts 14 are also substandard. This may be due to misalignment of the probe card 20 and wafer 10 or due to contaminants on the mating surfaces thereof. The resistivity of the contacts 22-1, 22-2, and of the contacts 14Vcc-1, 14Vcc-2, are also components of the resistance $R_x$. Accordingly, a high value for $R_x$ may indicate contaminated or dirty probe contacts 22, or wafer contacts 14. Referring to FIG. 7, a test method using the probe card 20 is illustrated. Initially the probe card contacts 22 are placed in electrical communication with the wafer contacts 14. With the probe card contacts 22 and wafer contacts 14 in electrical communication, the resistivity measuring circuitry 38 (FIG. 6B) can be used to evaluate the contact resistances (Rc1 and Rc2) between the resistivity contacts 22-1, 22-2 (FIG. 6A) and the selected contacts 14Vcc-1, 14Vcc-2 on the wafer 10.

The measured contact resistance can be used to provide feedback to the tester 26 for generating test signals. For example, with high contact resistance the test signals to the probe card contacts 22 can be adjusted to compensate for the high contact resistance. The adjusted test signals can then be analyzed by the tester 26. Also, if the measured contact resistance is too high an operator of the probe test system 16 can be notified. If the contact resistance is within an acceptable range, the test signals can be analyzed without adjustment. The measured contact resistance can also be an indication that the probe card contacts 22 require cleaning, or that the probe card contacts 22 and the wafer contacts 14 are misaligned.

METHOD OF FABRICATION

Referring to FIGS. 8A–8D, a method for fabricating the probe card 20 with the contacts 22C of FIG. 5C is illustrated.

Figure 8A:
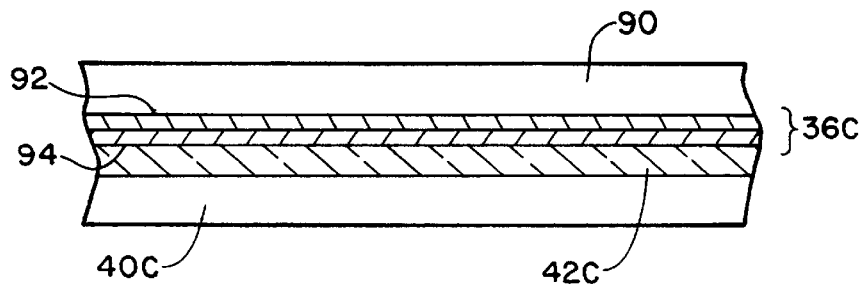
FIGS. 8A–8D are schematic cross sectional views illustrating process steps in fabricating the probe card embodiment of FIG. 5C.

In the illustrative method the conductors 36C comprise a bi-metal stack including a barrier layer 94 and a conductive layer 92. Initially as shown in FIG. 8A, the substrate 40C is formed or provided. In the illustrative embodiment the substrate 40C comprises silicon.

As also shown in FIG. 8A, the insulating layer 42C can be formed on the substrate 40C to protect and insulate the substrate 40C. The insulating layer 42C can be formed of an electrically insulating material such as an oxide, dielectric or insulating polymer. A representative thickness for the insulating layer 42C can be from about 1000 Å to 10 µm.

By way of example, the insulating layer 42C can be silicon dioxide ($SiO_2$) deposited using a CVD process. With a CVD process, TEOS (tetraethylorthosilane) can be injected into a reaction chamber to grow silicon dioxide ($SiO_2$) at a temperature of about 400° C. The insulating layer 42C can also be formed by exposing the substrate 40C to an oxidizing atmosphere in a reaction chamber. Furthermore, the insulating layer 42C can be formed of a dielectric material, such as $Si_3N_4$, deposited using CVD or other deposition process. Still further, the insulating layer 42C can be formed of polyimide, or similar electrically insulating polymeric material, spun on or otherwise deposited on the substrate 40C. In the case of a polymeric material, the natural resiliency of the material allows the insulating layer 42C to function as a compliant layer. This compliancy will allow the subsequently formed contacts 22C (FIG. 8D) to flex to accommodate dimensional variations in the z-direction.

Following formation of the insulating layer 42C, the conductors 36C can be formed on the insulating layer 42C. The conductors 36C include the barrier layer 94 formed on the insulating layer 42C and the conductive layer 92 formed on the barrier layer 94.

The barrier layer 94 can comprise an inert metal such as a titanium (Ti) or an alloy of titanium such as TiW or TiN. Other suitable materials for the barrier layer 94 include tungsten (W), and alloys of tungsten such as WN. The barrier layer 94 provides adhesion to the substrate 40C and prevents diffusion of the conductive layer 92 into the substrate 40C. The barrier layer 94 can be blanket deposited using a suitable deposition process such as CVD, sputtering, or plating. A representative thickness for the barrier layer 94 is from 200 Å to 1 µm.

The conductive layer 92 can then be blanket deposited on the barrier layer 94. The conductive layer 92 is preferably formed of a highly conductive metal such as copper, aluminum, titanium, tantalum, tungsten, molybdenum or alloys of these metals. The conductive layer 92 can be blanket deposited on the barrier layer 94 by CVD or sputtering. The conductive layer 92 can also be deposited on the barrier layer 94 using electroplating or electroless plating. In this case, the barrier layer 94 can function as a nucleation surface for forming the conductive layer 92. In a similar manner the conductive layer 92 can function as a nucleation surface for subsequent formation of contacts 22C (FIG. 8C). A representative thickness for the conductive layer 92 can be from about 200 Å to 1 µm.

Still referring to FIG. 8A, following blanket deposition of the conductive layer 92, a layer of resist 90 is deposited on the conductive layer 92 and developed. The layer of resist 90 can be deposited using a spin-on process and then soft baked to drive out solvents. A typical thickness for the layer of resist 90 can be about 1,000 Å to 30,000 Å. Following the softbake, the layer of resist 90 can be aligned with a mask and exposed using collimated UV light.

Next, the layer of resist 90 (FIG. 8A) can be developed to form a resist mask (not shown) which is used to etch the conductive layer 92 and barrier layer 94 to form the pattern of bi-metal conductors 36C. Depending on the material used to form the conductive layer 92 and barrier layer 94, a suitable wet etch process can be used to etch the layers to form the conductors 36C. As an example, for a conductive layer 92 comprising aluminum and a barrier layer 94 comprising TiN, a wet etchant such as $H_3PO_4$ followed by $NH_4OH$ can be used to etch the pattern of conductors 36C.

Following formation of the bi-metal conductors 36C, the layer of resist 90 can be stripped using a suitable wet etchant along with organic ashing. For a positive resist, a solvent such as acetone, methylethylketone or 1-methylethylketone can be used. For a negative resist, a solution that will not attack the underlying metal can be used.

Figure 8B:
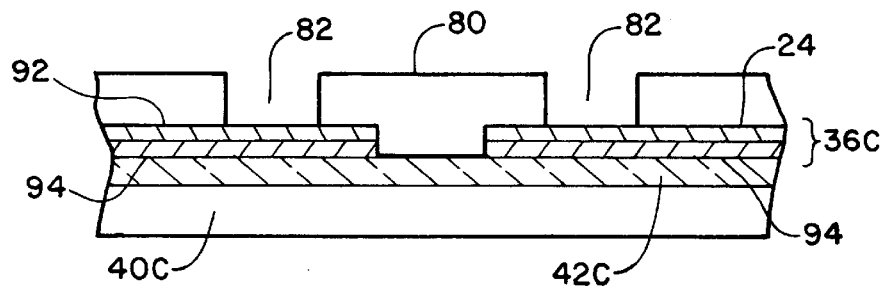
Figure 8C:
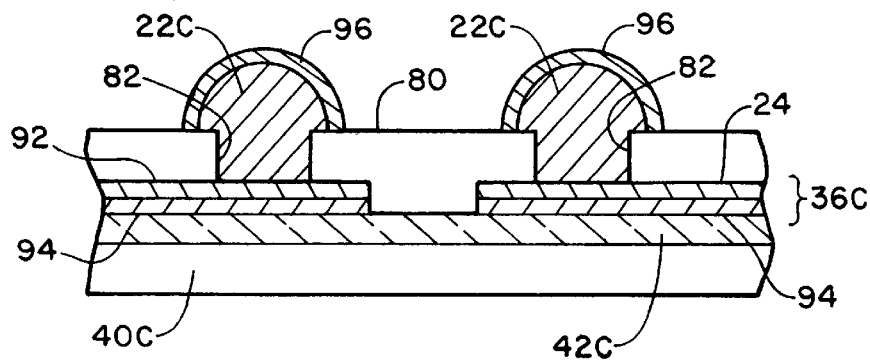

Referring to FIG. 8B, following formation of the conductors 36C, the mask layer 80 can be deposited. The mask layer comprises an elastomeric material. One suitable material for forming the mask layer 80 comprises polyimide deposited using a spin on process. A representative thickness of the mask layer 80 can be from 1 to 5 mils. Next the mask layer 80 can be patterned and etched to form the pattern of openings 82 in alignment with the conductors 36C. Preferably the openings 82 are located near a terminal end of the conductors 36C. The location of the openings 82 corresponds to the pattern of the wafer contacts 14 (FIG. 2). Patterning and etching the openings 32 for the mask layer 30 can be performed using a resist mask as previously described and a suitable wet etchant.

Next, as shown in FIG. 8C, the contacts 22C are formed on the conductors 36C by filling the openings 82 with metal. Suitable metals include copper, nickel, gold and palladium. One method for forming the contacts 22C comprises an electroplating process. Equipment and solutions used for electroplating the above metals are well known in the art.

Another method is with an electroless plating process. With electroless plating, an aqueous solution comprising metal ions and reducing agents is used. These solutions are also known in the art. For example, electroless plating of nickel can be performed using a solution containing Ni ions and a reducing agent such as hypophosphite or dimethylamine borane. Electroless plating of copper can be performed using a solution containing Cu ions and a suitable reducing agent.

Following formation of the contacts 22C, a cap layer 96 can optionally be formed on the exposed tip portions of the contacts 22C. The cap layer 96 can be formed of an inert metal that will inhibit oxidation and diffusion of the metal which forms the contacts 22C. The cap layer 96 can be formed using an electroplating process, an electroless plating process, or a metallization process (e.g., deposition, photopatterning, etching). Suitable metals for forming the cap layer 96 include palladium, gold, and platinum. For applications in which a hard metal is required the cap layer 96 can comprise tungsten. A representative thickness for the cap layer 96 can be from 100 Å to 2 µm.

Figure 8D:
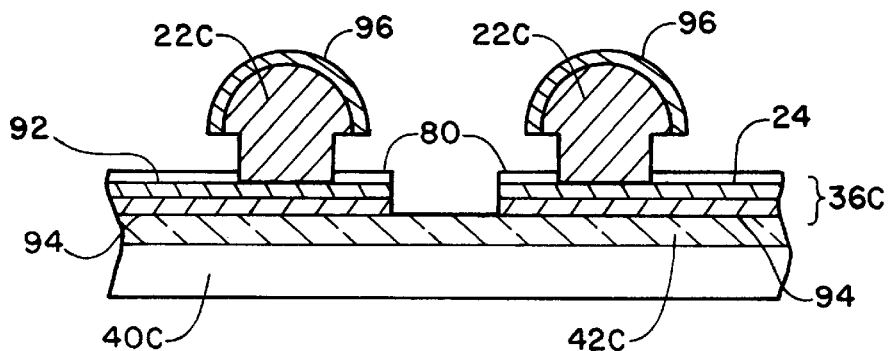

Following formation of the contacts 22C and as shown in FIG. 8D, the mask layer 80 can be partially stripped, as previously described, leaving a thin layer insulating the conductors 36C.

Thus the invention provides an improved probe card for testing semiconductors wafers, a system for testing wafers using the probe card, a method for testing wafers using the probe card, and a method for fabricating the probe card. The probe card includes resistivity contacts configured for use with resistivity measuring circuitry.

While the invention has been described with reference to certain preferred embodiments, as will be apparent to those skilled in the art, certain changes and modifications can be made without departing from the scope of the invention as defined by the following claims.

What is claimed is:

1. A probe card for testing a semiconductor wafer having a plurality of wafer contacts comprising:

a substrate;

a plurality of probe contacts on the substrate configured to electrically engage the wafer contacts;

the probe contacts including a first resistivity contact configured to electrically engage a first wafer contact and a second resistivity contact configured to electrically engage a second wafer contact which is electrically connected to the first wafer contact;

a plurality of conductors on the substrate in electrical communication with the first resistivity contact and the second resistivity contact and configured for use with a resistivity measuring circuit for evaluating a contact resistance between the probe contacts and the wafer contacts.

2. The probe card of claim 1 wherein the conductors comprise a four point Kelvin structure.

3. The probe card of claim 1 wherein the first wafer contact and the second wafer contact comprise interconnected power pads.

4. The probe card of claim 1 wherein the probe contacts comprise an element selected from the group consisting of projections on the substrate at least partially covered with first conductive layers, microbumps on a polymer film on the substrate, and indentations in the substrate at least partially covered with second conductive layers.

5. A probe card for testing a semiconductor wafer comprising:

a substrate;

a pair of probe contacts on the substrate configured to electrically engage a pair of interconnected wafer contacts on the wafer; and four conductors on the substrate in electrical communication with the probe contacts and configured as a Kelvin structure adapted to evaluate a contact resistance between the pair of probe contacts and the pair of wafer contacts.

6. The probe card of claim 5 wherein the four conductors comprise two sense leads and two source leads configured for use with a resistivity measuring circuit.

7. The probe card of claim 5 wherein the pair of wafer contacts comprise electrically connected power contacts.

8. A probe card for testing a semiconductor wafer having a first wafer contact electrically connected to a second wafer contact comprising:

a substrate;

a first resistivity contact on the substrate for electrically engaging the first wafer contact and a second resistivity contact on the substrate for electrically engaging the second wafer contact;

a source high conductor and a sense high conductor on the substrate in electrical communication with the first resistivity contact; and a source low conductor and a sense low conductor on the substrate in electrical communication with the second resistivity contact;

the source high conductor, the source low conductor, the sense high conductor, and the sense low conductor configured for use with a resistivity measuring circuit to evaluate a contact resistance between the first resistivity contact and the first wafer contact or between the second resistivity contact and the second wafer contact.

9. The probe card of claim 8 wherein the first wafer contact and the second wafer contact comprise power contacts.

10. The probe card of claim 8 wherein the first resistivity contact and the second resistivity contact comprise penetrating projections on the substrate.

11. The probe card of claim 8 wherein the first resistivity contact and the second resistivity contact comprise microbumps on a polymer film attached to the substrate.

12. The probe card of claim 8 wherein the first resistivity contact and the second resistivity contact comprise indentations in the substrate at least partially covered with conductive layers.

13. The probe card of claim 8 wherein the first resistivity contact and the second resistivity contact comprise microbumps in openings of an elastomeric mask layer on the substrate.

14. A probe card for testing a semiconductor wafer having two interconnected wafer contacts comprising:

a substrate;

two probe contacts on the substrate configured to electrically engage the two wafer contacts; and four conductors on the substrate in electrical communication with the two probe contacts and configured for electrical communication with a resistivity measuring circuit for evaluating a contact resistance between the two probe contacts and the two wafer contacts.

15. The probe card of claim 14 wherein the two wafer contacts comprise power contacts.

16. The probe card of claim 14 wherein each probe contact comprises a penetrating projection at least partially covered with a conductive layer.

17. The probe card of claim 14 wherein each probe contact comprises a microbump on a polymer film.

18. The probe card of claim 14 wherein the two wafer contacts comprise bumps and the two probe contacts comprise indentations covered with conductive layers configured to retain the bumps.

19. The probe card of claim 14 wherein the two probe contacts comprise microbumps in openings of an elastomeric mask layer on the substrate.

20. The probe card of claim 14 wherein the conductors and the two probe contacts comprise a four point Kelvin structure.

* * * * *